United States Patent
Pattipaka et al.

(10) Patent No.: US 12,424,992 B2
(45) Date of Patent: Sep. 23, 2025

(54) DIFFERENTIAL TO SINGLE-ENDED SUMMATION CIRCUIT WITH IMPROVED COMMON-MODE REJECTION RATIO

(71) Applicant: Texas Instruments Incorporated, Dallas, TX (US)

(72) Inventors: Ravikumar Pattipaka, Bangalore (IN); Prashuk Jain, Bangalore (IN); Vajeed Nimran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 398 days.

(21) Appl. No.: 17/990,682

(22) Filed: Nov. 19, 2022

(65) Prior Publication Data

US 2024/0171144 A1    May 23, 2024

(51) Int. Cl.
*H03F 3/45*    (2006.01)

(52) U.S. Cl.
CPC ..... *H03F 3/45928* (2013.01); *H03F 3/45076* (2013.01); *H03F 2200/231* (2013.01); *H03F 2200/294* (2013.01)

(58) Field of Classification Search
CPC ............. H03F 3/45928; H03F 3/45076; H03F 2200/231; H03F 2200/294; H03F 2203/45138; H03F 3/211; H03F 3/45475; H03F 1/26; H03K 19/017545; H03K 19/003

USPC ............... 330/69, 295, 124 R, 301
See application file for complete search history.

(56) References Cited

U.S. PATENT DOCUMENTS

| | | | |
|---|---|---|---|
| 11,867,773 B2* | 1/2024 | Basu ................. | G01R 33/0029 |
| 2005/0203391 A1* | 9/2005 | Phelps ............... | G01S 15/8927 |
| | | | 600/437 |
| 2013/0039151 A1* | 2/2013 | Nimran P. A. ...... | G01S 7/52038 |
| | | | 327/356 |
| 2023/0314580 A1* | 10/2023 | Steward ................. | G01S 7/524 |
| | | | 367/7 |

* cited by examiner

*Primary Examiner* — Hieu P Nguyen
(74) *Attorney, Agent, or Firm* — Mandy Barsilai Fernandez; Frank D. Cimino

(57) ABSTRACT

A differential to single-ended summation circuit includes a first switch which includes a first terminal coupled to a first circuit input and includes a second terminal. The circuit includes a second switch which includes a first terminal coupled to a second circuit input and includes a second terminal. The circuit includes a holding capacitor which includes a first terminal coupled to the second terminal of the first switch and a second terminal coupled to the second terminal of the second switch. The circuit includes a third switch which includes a first terminal coupled to the second terminal of the first switch and a second terminal coupled to a circuit output. The circuit includes a fourth switch including a first terminal coupled to the second terminal of the second switch and a second terminal coupled to a common potential.

18 Claims, 7 Drawing Sheets

DIFFERENTIAL TO SINGLE-ENDED SUMMATION CIRCUIT WITH IMPROVED COMMON-MODE REJECTION RATIO

TECHNICAL FIELD

This description relates generally to systems for reducing common mode noise in electronic circuits, and more particularly to a differential to single-ended summation circuit which reduces common mode noise and improves common-mode rejection ratio (CMMR).

BACKGROUND

In ultrasound imaging systems, wireless communication systems and electronic test systems, low-power signals are generally amplified and processed. In ultrasound imaging systems, thousands of transducer elements may be used to convert ultrasound signals into electrical signals. Because the electrical signals converted from ultrasound signals are typically very low-power signals, low-noise amplifiers (LNAs) may be used to amplify the electrical signals. The LNAs amplify the low-power signals and provide differential voltage signals on differential lines. The differential voltage signals are later combined (e.g., added) and converted into a single-ended signal by, for example, a differential to single-ended summation circuit.

Because the transducer elements are generally coupled to respective LNAs, as the number of transducer elements increase in an ultrasound imaging system, the number of LNAs also increase. As a result, the number of differential lines increase, which increases parasitic capacitances which may be present between the differential lines and a common potential (e.g., ground).

Common-mode noise may present on the differential lines. Common-mode noise appears simultaneously and in-phase on the differential lines and conduct to the common potential via parasitic capacitors. Common-mode noise may be caused by electromagnetic interference (EMI) or may be caused by signals coupled from circuit board traces or conductors. Common mode noise may increase differential crosstalk in differential signal paths and may degrade signal integrity. The presence of common-mode noise degrades the common-mode rejection ratio (CMRR) of the LNAs. Also, common-mode noise appears as an offset at the output of the differential to single-ended summation circuit.

SUMMARY

In one aspect, a differential to single-ended summation circuit includes a first circuit input, a second circuit input and a circuit output. The circuit includes a first switch which includes a first terminal coupled to the first circuit input and includes a second terminal. The circuit includes a second switch which includes a first terminal coupled to the second circuit input and includes a second terminal. The circuit includes a holding capacitor which includes a first terminal coupled to the second terminal of the first switch and a second terminal coupled to the second terminal of the second switch. The circuit includes a third switch which includes a first terminal coupled to the second terminal of the first switch and a second terminal coupled to the circuit output. The circuit includes a fourth switch which includes a first terminal coupled to the second terminal of the second switch and a second terminal coupled to a common potential. The circuit includes a fifth switch which includes a first terminal coupled to the first terminal of the holding capacitor and a second terminal coupled to the second terminal of the holding capacitor.

In an additional aspect, the circuit includes a second capacitor which includes a first terminal coupled to the first circuit input and a second terminal coupled to the common potential.

In an additional aspect, the first and second switches are closed and the third and fourth switches are opened in a summing phase.

In an additional aspect, the first and second switches are opened and the third and fourth switches are closed in a transfer phase.

In an additional aspect, the fifth switch is opened in a summing phase and in a transfer phase, and wherein the fifth switch is closed in a reset phase.

In an additional aspect, a differential to single-ended summation circuit includes a first circuit input, a second circuit input and a circuit output. The circuit includes a first switch which includes a first terminal coupled to the first circuit input and includes a second terminal. The circuit includes a second switch which includes a first terminal coupled to the second circuit input and includes a second terminal. The circuit includes a holding capacitor which includes a first terminal coupled to the second terminal of the first switch and a second terminal coupled to the second terminal of the second switch. The circuit includes a third switch which includes a first terminal coupled to the second terminal of the first switch and a second terminal coupled to the circuit output. The circuit includes a fourth switch which includes a first terminal coupled to the second terminal of the second switch and a second terminal coupled to a common potential. The circuit includes a fifth switch which includes a first terminal coupled to the first terminal of the holding capacitor and a second terminal coupled to the second terminal of the holding capacitor. The circuit includes a second capacitor which includes a first terminal coupled to the first circuit input and a second terminal coupled to the common potential.

In an additional aspect, a system includes an amplifier which includes an amplifier input, a first amplifier output and a second amplifier output. The system includes a delay circuit which includes a first delay input coupled to the first amplifier output, a second delay input coupled to the second amplifier output and includes a first delay output and a second delay output. The system includes a differential to single-ended summation circuit which includes a first circuit input coupled to the first delay output, a second circuit input coupled to the second delay output and includes a circuit output. The system includes a first switch which includes a first terminal coupled to the first circuit input and includes a second terminal. The system includes a second switch which includes a first terminal coupled to the second circuit input and includes a second terminal. The system includes a holding capacitor which includes a first terminal coupled to the second terminal of the first switch and a second terminal coupled to the second terminal of the second switch. The system includes a third switch which includes a first terminal coupled to the second terminal of the first switch and a second terminal coupled to the circuit output. The system includes a fourth switch which includes a first terminal coupled to the second terminal of the second switch and a second terminal coupled to a common potential. The system includes a fifth switch which includes a first terminal coupled to the first terminal of the holding capacitor and a second terminal coupled to the second terminal of the holding capacitor. The system includes a second capacitor which includes a first terminal coupled to the first circuit input and a second terminal coupled to the common potential.

BRIEF DESCRIPTION OF THE DRAWINGS

The same reference numerals or other feature designators are used in the drawings to designate the same or similar (functionally and/or structurally) features.

DETAILED DESCRIPTION

Figure 1:
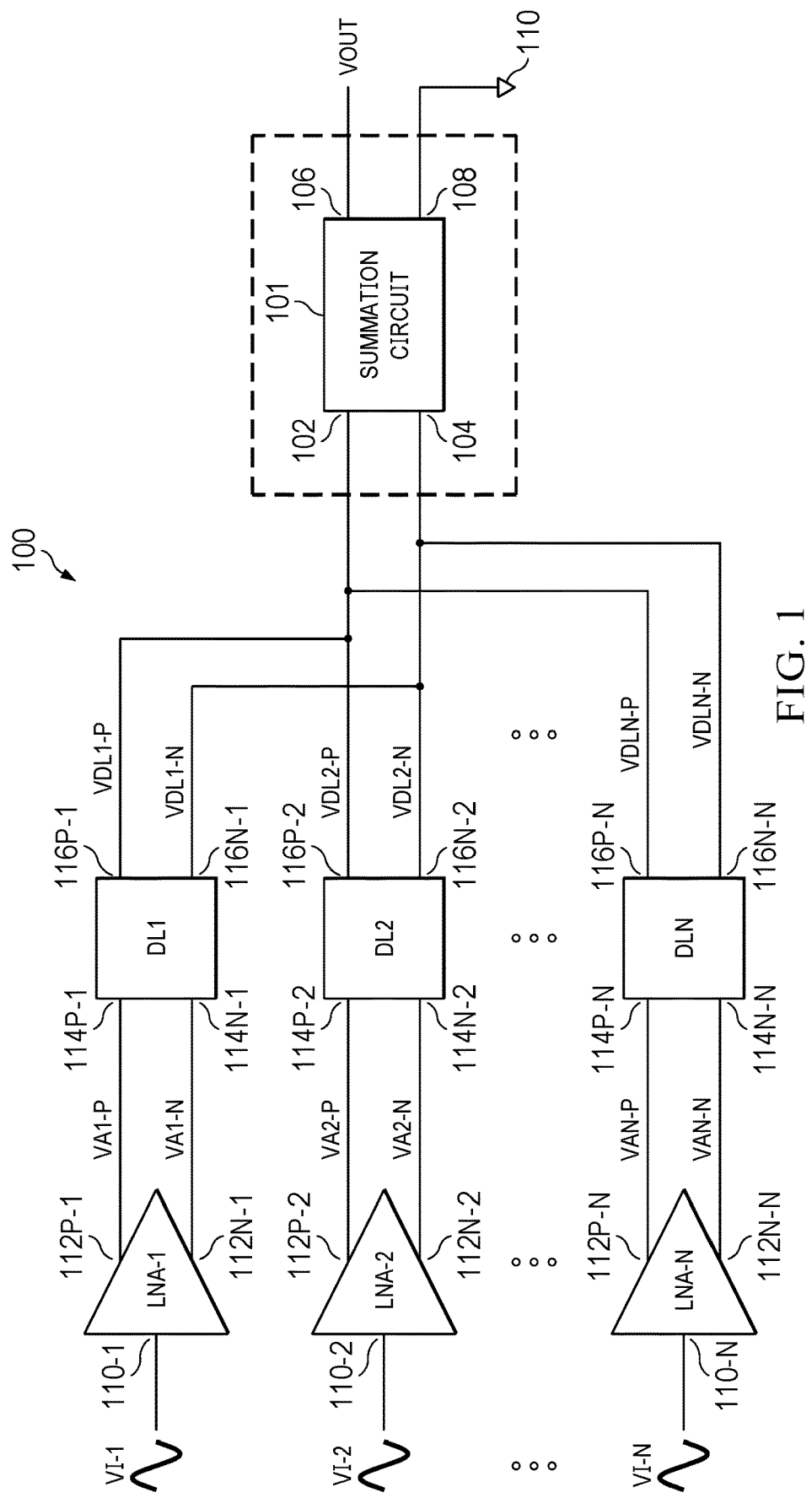
FIG. 1 is a block diagram illustrating a system of an example embodiment.

FIG. 1 is a block diagram illustrating system 100 of an example embodiment. System 100 includes differential to single-ended summation circuit 101 which combines (e.g., adds) a plurality of differential voltage signals into a single-ended output voltage. Circuit 101 reduces common-mode noise which may appear on differential input lines. By reducing common-mode noise on differential input lines, circuit 101 improves its common-mode rejection ratio.

System 100 includes amplifiers LNA-1-LNA-N. In some example embodiments, amplifiers LNA-1-LNA-N are low-noise amplifiers that amplify a very low power signal in the presence of a noise signal without significantly degrading their signal-to-noise ratio (SNR). LNA-1-LNA-N have respective inputs 110-1-110-N adapted to receive single-ended input signals. For example, LNA-1 receives single-ended voltage signal VI-1 at input 110-1 (also referred to as amplifier input 110-1) and LNA-N receives single-ended voltage signal VI-N at input 110-N (also referred to as amplifier input 110-N). The single-ended voltage signals (e.g., VI-1-VI-N) may be generated by, for example, transducers or antennas (not shown in FIG. 1).

The LNAs amplify and convert the single-ended input signals into differential signals. For example, in response to voltage signal VI-1, LNA-1 provides voltage signals VA1-P and VA1-N at respective outputs 112P-1 (also referred to as non-inverting output or first amplifier output 112P-1) and 112N-1 (also referred to as inverting output or second amplifier output 112N-1). Voltage signals VA1-P and VA1-N are balanced because they have equal amplitude but opposite polarity. Similarly, in response to voltage signal VI-N, LNA-N provides voltage signals VAN-P and VAN-N at respective outputs 112P-N (also referred to as non-inverting output or first amplifier output 112P-N) and 112N-N (also referred to as inverting output or second amplifier output 112N-N).

System 100 includes delay circuits DL1-DLN configured to align the differential voltage signals provided by LNA-1-LNA-N. For example, input voltages VI-1-VI-N may be generated by transducer elements or antenna elements. Depending on the positions of the transducer elements or antenna elements, input voltages VI1-VIN may not be aligned in phase with each other. As a result, the differential voltage signals provided by LNA-1-LNA-N may not be aligned in phase with each other.

Delay circuit DL1 includes input 114P-1 (also referred to as non-inverting input or first delay input) coupled to receive voltage signal VA1-P and includes input 114N-1 (also referred to as inverting input or second delay input) coupled to receive voltage signal VA1-N. Delay circuit DLN includes input 114P-N (also referred to as non-inverting input or first delay input) coupled to receive voltage signal VAN-P and includes input 114N-N (also referred to as inverting input or second delay input) coupled to receive voltage signal VAN-N. Delay circuits DL1-DLN apply respective delays to the differential voltage signals so that they are aligned in phase with each other. Delay circuit DL1 provides voltage signal VDL1-P at output 116P-1 (also referred to as non-inverting output or first delay output) and provides voltage signal VDL1-N at output 116N-1 (also referred to as inverting output or second delay output). Delay circuit DLN provides voltage signal VDLN-P at output 116P-N (also referred to as non-inverting output or first delay output) and provides voltage signal VDLN-N at output 116N-N (also referred to as inverting output or second delay output). Because voltage signals VDL1-P and VDL1-N are differential signals (e.g., complementary signals), the time delay applied by the delay circuits DL1 and DLN results in voltage signal VDL1-P being aligned in phase with voltage signal VDLN-P and voltage signal VDL1-N being aligned in phase with voltage signal VDLN-N. More generally, each delay circuit DLn is configured to apply a delay to its input voltage signals VAn-P and VAn-N, such that all output voltage signals VDL1-P-VDLN-P are phase aligned and all output voltage signals VDL1-N-VDLN-N are phase aligned.

System 100 includes differential to single-ended summation circuit 101 which combines (e.g., adds) the differential voltage signals provided by delay circuits DL1-DLN into a single-ended output voltage. Summation circuit 101 includes input 102 (also referred to as non-inverting input or first circuit input) coupled to receive voltage signals VDL1-P-VDLN-P and includes input 104 (also referred to as inverting input or second circuit input) coupled to receive voltage signals VDL1-N-VDLN-N. Summation circuit 101 includes circuit output 106 and includes terminal 108 coupled to a common potential 110 (e.g., ground). Summation circuit 101 combines the differential voltage signals VDL1-P-VDL1-N and VDLN-P-VDLN-N and provides a single-ended output voltage VOUT at circuit output 106.

Figure 2A:
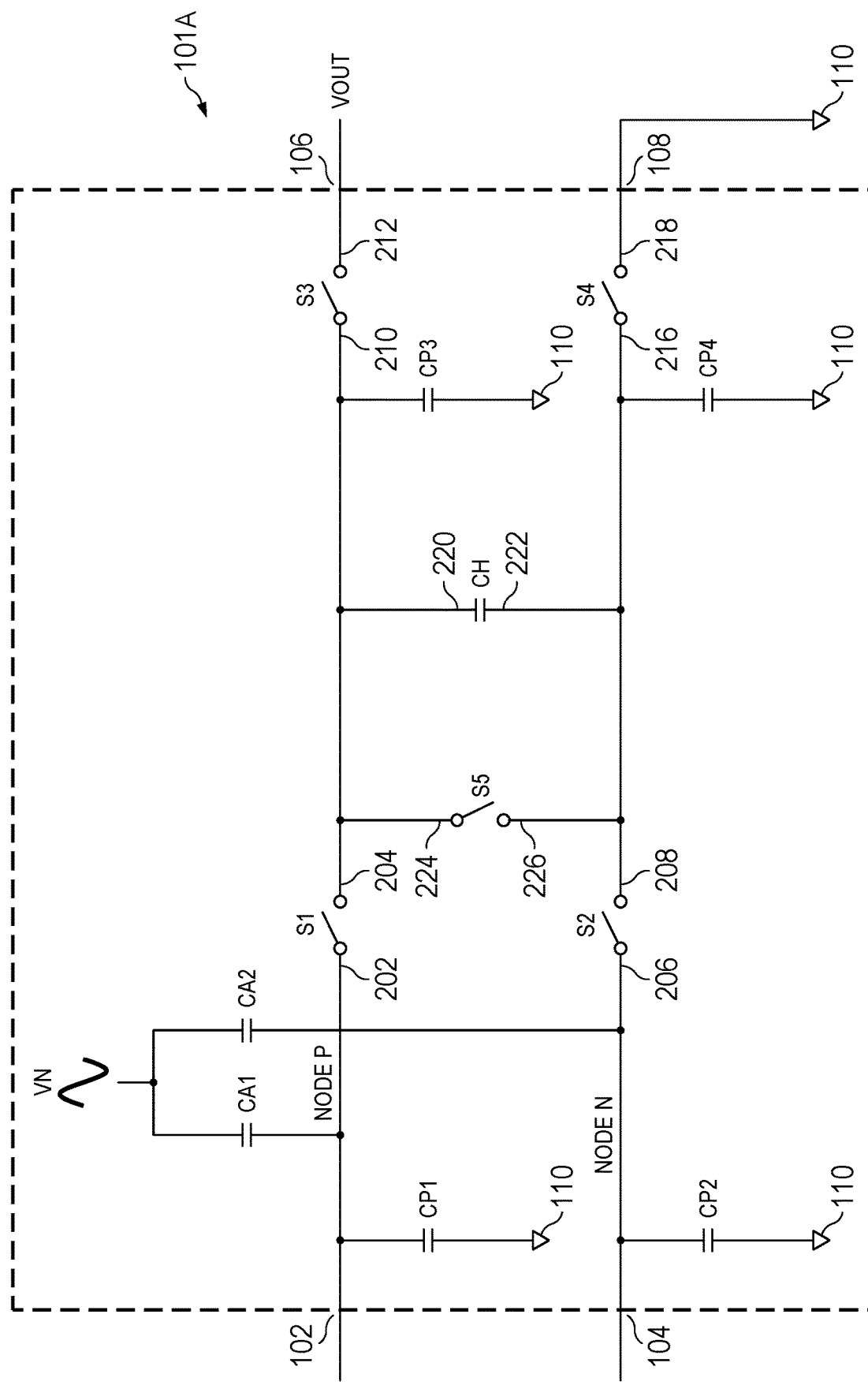
FIGS. 2A, 2B and 2C are schematic diagrams illustrating a differential to single-ended summation circuit of an example embodiment.

FIG. 2A is a schematic diagram illustrating differential to single-ended summation circuit 101A of an example embodiment. Summation circuit 101A is an example implementation of summation circuit 101 illustrated in FIG. 1. Summation circuit 101A combines the differential voltage signals from delay circuits DL1-DLN (shown in FIG. 1) into a single-ended output voltage VOUT.

Circuit 101A includes first circuit input 102 coupled to receive voltage signals VDL1-P-VDLN-P (shown in FIG. 1) and includes second circuit input 104 coupled to receive voltage signals VDL1-N-VDLN-N. Circuit 101A includes first switch S1 which includes first terminal 202 coupled to first circuit input 102 and includes second terminal 204. Circuit 101A includes second switch S2 which includes first terminal 206 coupled to second circuit input 104 and includes second terminal 208. Circuit 101A includes holding capacitor CH (e.g., around 8 pico-farads to around 10 pico-farads) which includes first terminal 220 coupled to second terminal 204 of first switch S1 and second terminal 222 coupled to second terminal 208 of second switch S2.

Circuit 101A includes third switch S3 which includes first terminal 210 coupled to second terminal 204 of first switch S1 and second terminal 212 coupled to circuit output 106. Circuit 101A includes fourth switch S4 which includes first terminal 216 coupled to second terminal 208 of second switch S2 and includes second terminal 218 coupled to terminal 108 which is coupled to common potential 110. Circuit 101A includes fifth switch S5 which includes first terminal 224 coupled to first terminal 220 of holding capacitor CH and second terminal 226 coupled to second terminal 222 of holding capacitor CH.

Parasitic capacitors may be present at different stages of the differential lines (e.g., differential signal paths) of circuit 101A. Parasitic capacitor CP1 (e.g., around 2 pico-farads to around 3 pico-farads) may be present between circuit input 102 and common potential 110. Parasitic capacitor CP1 represents an equivalent capacitance which may be present between non-inverting outputs (e.g., 116P-1-116P-N) of delay circuits DL1-DLN (shown in FIG. 1) and first circuit input 102. Parasitic capacitor CP2 may be present between second circuit input 104 and common potential 110. Parasitic capacitor CP2 (e.g., around 2 pico-farads to around 3 pico-farads) represents an equivalent capacitance which may be present between inverting outputs (e.g., 116N-1-116N-N) of delay circuits DL1-DLN (shown in FIG. 1) and second circuit input 104. Parasitic capacitor CP3 (e.g., around 400 femto-farads to around 600 femto-farads) represents an equivalent capacitance which may be present between switches S1 and S3, and parasitic capacitor CP4 (400 femto-farads to around 600 femto-farads) represents an equivalent capacitance which may be present between switches S2 and S4.

Also, parasitic capacitors may be present between a power supply (not shown in FIG. 2A) and the differential lines of circuit 101A. Due to the presence of parasitic capacitors, common-mode noise VN from the power supply may be coupled to the differential lines of circuit 101A. Parasitic capacitor CA1 may be present between a power supply (not shown in FIG. 2A) and first circuit input 102. Parasitic capacitor CA1 (e.g., around 20 femto-farads to around 50 femto-farads) may couple common-mode noise VN from the power supply to first circuit input 102. Parasitic capacitor CA2 may be present between the power supply and second circuit input 104. Parasitic capacitor CA2 (e.g., around 20 femto-farads to around 50 femto-farads) may couple common-mode noise VN from the power supply to second circuit input 104. Common-mode noise VN may flow from the power supply through CA1 to node P and may flow from the power supply through CA2 to node N. Common-mode noise VN may flow from node P through CP1 to common potential 110 and may flow from node N through CP2 to common potential 110. As a result, parasitic capacitors CP1 and CP2 may be charged by common-mode noise VN.

Figure 2B:
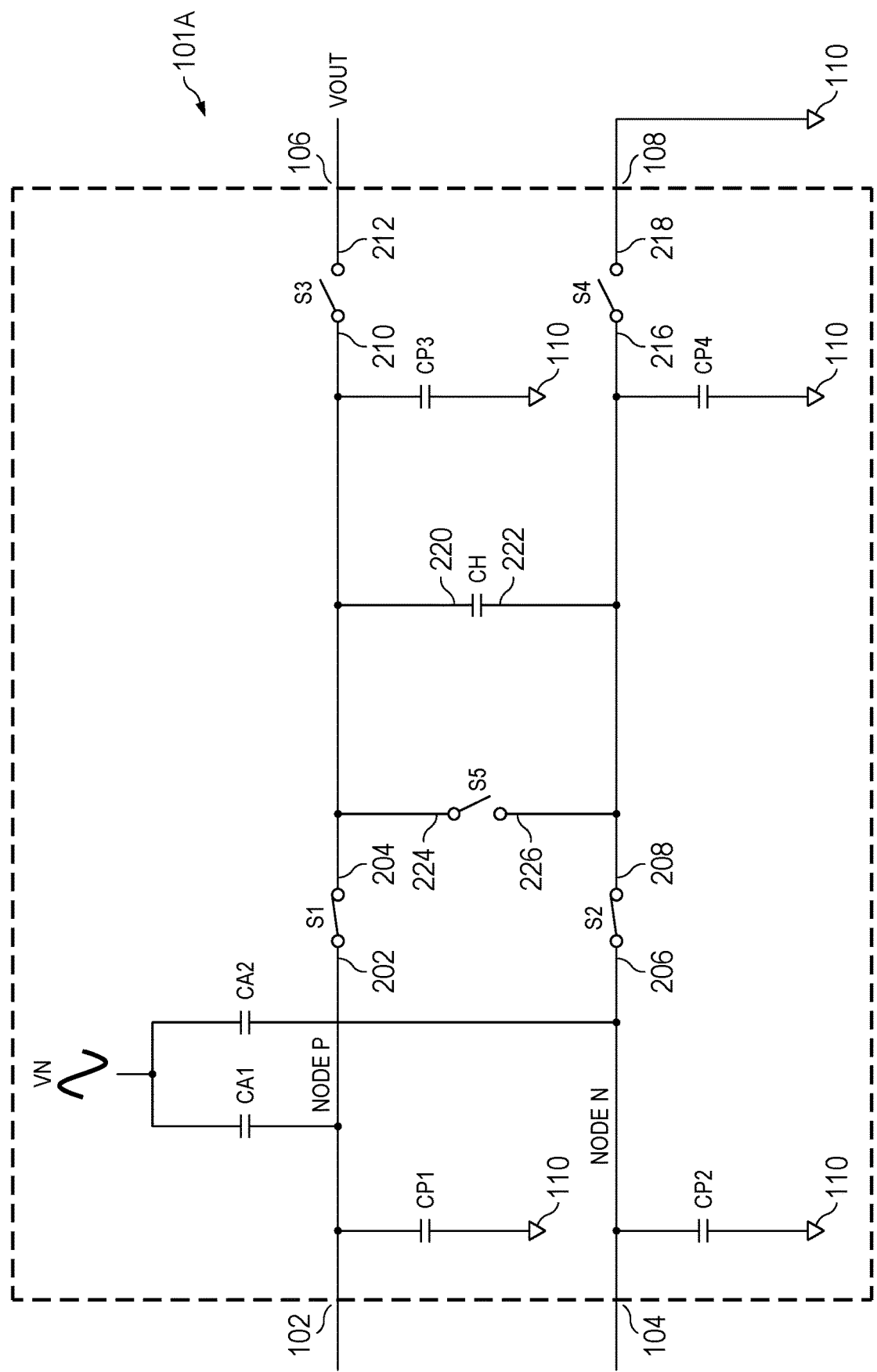

In some example embodiments, circuit 101A is operated in (1) a summing phase; (2) a transfer phase; and (3) a reset phase. FIG. 2B is a schematic diagram illustrating positions of switches S1, S2, S3, S4 and S5 in the summing phase. In the summing phase, switches S1 and S2 are closed but switches S3, S4 and S5 are opened. Thus, first terminal 202 of S1 is electrically connected to second terminal 204 of S1, thus allowing current to conduct from first terminal 202 to second terminal 204. Also, first terminal 206 of S2 is electrically connected to second terminal of S2, thus allowing current to conduct from first terminal 206 to second terminal 208. Thus, holding capacitor CH is coupled between first and second circuit inputs 102 and 104. Also, first terminal 210 of S3 is electrically disconnected from second terminal 212 of S3, and first terminal 216 is electrically disconnected from second terminal 218. Thus, holding capacitor CH is disconnected from circuit output 106.

In the summing phase, holding capacitor CH is charged to a differential voltage which is approximately an average of the differential voltages at the outputs of the delay circuits DL1-DLN. Thus, holding capacitor CH is charged to a voltage which is approximately an average of differential voltages {VDL1-P, VDL1-N}-{VDLN-P, VDLN-N}.

Also, in the summing phase, common-mode noise VN may flow from node P through CP3 to common potential 110 and may flow from node N through CP4 to common potential 110. As a result, parasitic capacitors CP3 and CP4 may be charged by common-mode noise VN.

Figure 2C:
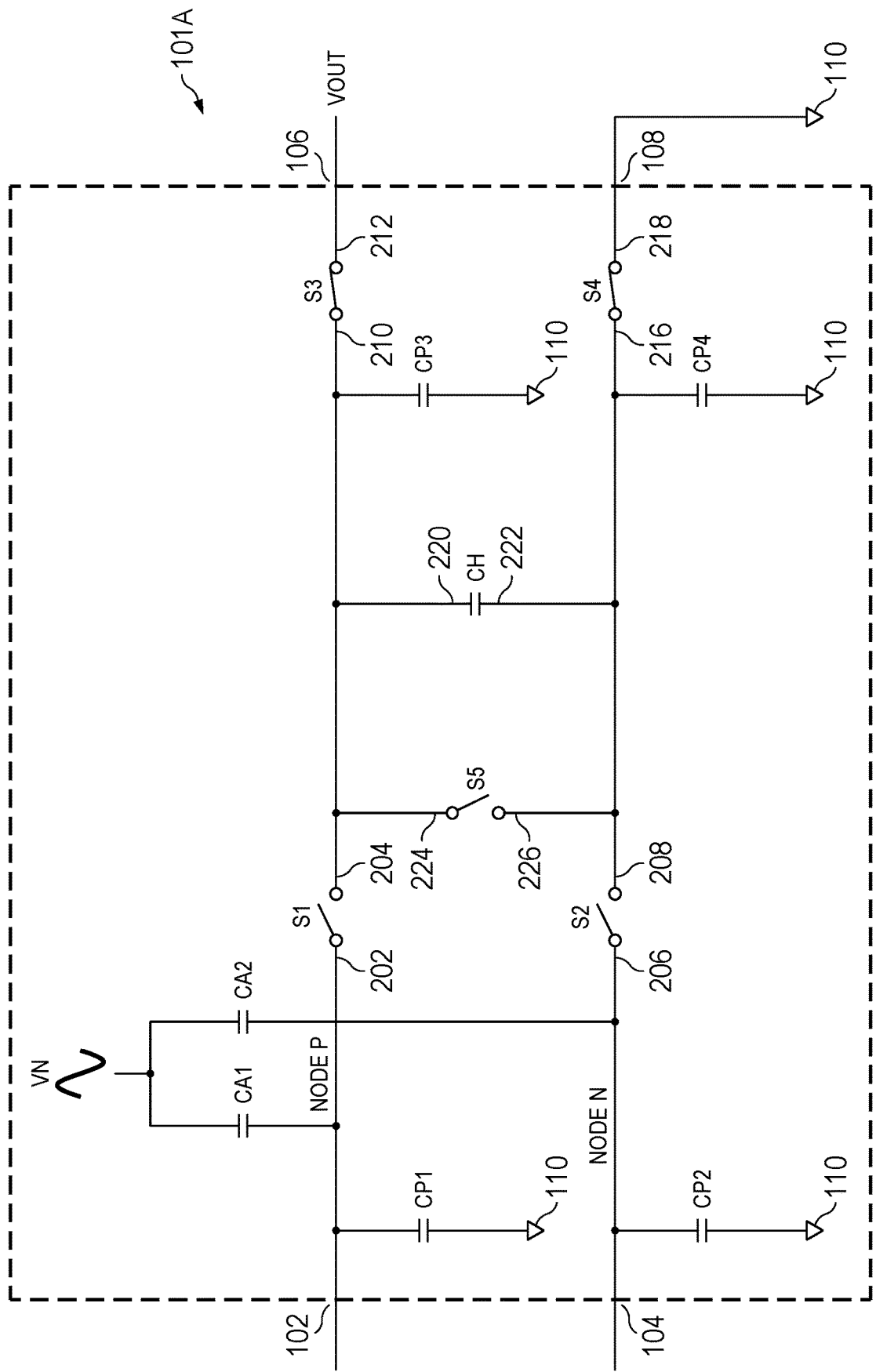

FIG. 2C is a schematic diagram illustrating positions of the switches in the transfer phase. In the transfer phase, switches S1, S2 and S5 are opened but switches S3 and S4 are closed. Thus, first terminal 220 of holding capacitor CH is coupled to circuit output 106 and second terminal 222 of CH is coupled to common potential 110. Also, first terminal 220 of CH is disconnected from first circuit input 102 and second terminal 222 of CH is disconnected to from second circuit input 104. Because switch S4 is closed in the transfer phase, any voltage across parasitic capacitor CP4 due to common-mode noise VN is discharged to common-potential 110. Thus, the CMRR of circuit 101A is not degraded by any voltage across CP4 due to common-mode noise VN at CP4.

Because switches S1 and S2 are opened in the transfer phase, parasitic capacitors CP1 and CP2 are electrically isolated from holding capacitor CH. Thus, any voltages across CP1 and CP2 due to common-mode noise VN are electrically isolated from CH, and as a result the CMRR of circuit 101 is not degraded by voltages across CP1 and CP2.

In the transfer phase, parasitic capacitor CP3 is coupled in parallel with holding capacitor CH. Thus, any voltage across CP3 due to common-mode noise VN is coupled to CH. As a result, CH is charged to a voltage which is based on a weighted average of the capacitance values of CH and CP3 and the previous voltage at CH and the voltage at CP3. In the transfer phase, output voltage VOUT is equal to the voltage across CH.

Because the voltage (e.g., voltage due to common-mode noise VN) at parasitic capacitor CP3 is coupled to holding capacitor CH, the CMRR of circuit 101A is degraded by parasitic capacitor CP3. However, the circuit topology illustrated in FIGS. 2A, 2B and 2C improves the CMRR compared to existing circuit topologies because switches S1 and S2 isolate parasitic capacitors CP1 and CP2 from holding capacitor CH, thereby isolating holding capacitor CH from any voltages (e.g., voltages due to common-mode noise) across CP1 and across CP2.

In some example embodiments, circuit 101A is operated in a reset phase prior to the summing phase. In the reset phase, only switch S5 is closed and switches S1, S2, S3 and S4 are opened. Thus, first terminal 220 of holding capacitor CH is coupled to second terminal 222 of CH, thereby resetting (e.g., discharging) CH. As a result, any residual voltage across capacitor CH is discharged, and in the next summing phase, CH is charged to a voltage which is approximately an average of the differential voltages provided by the delay circuits DL1-DLN.

Figure 3A:
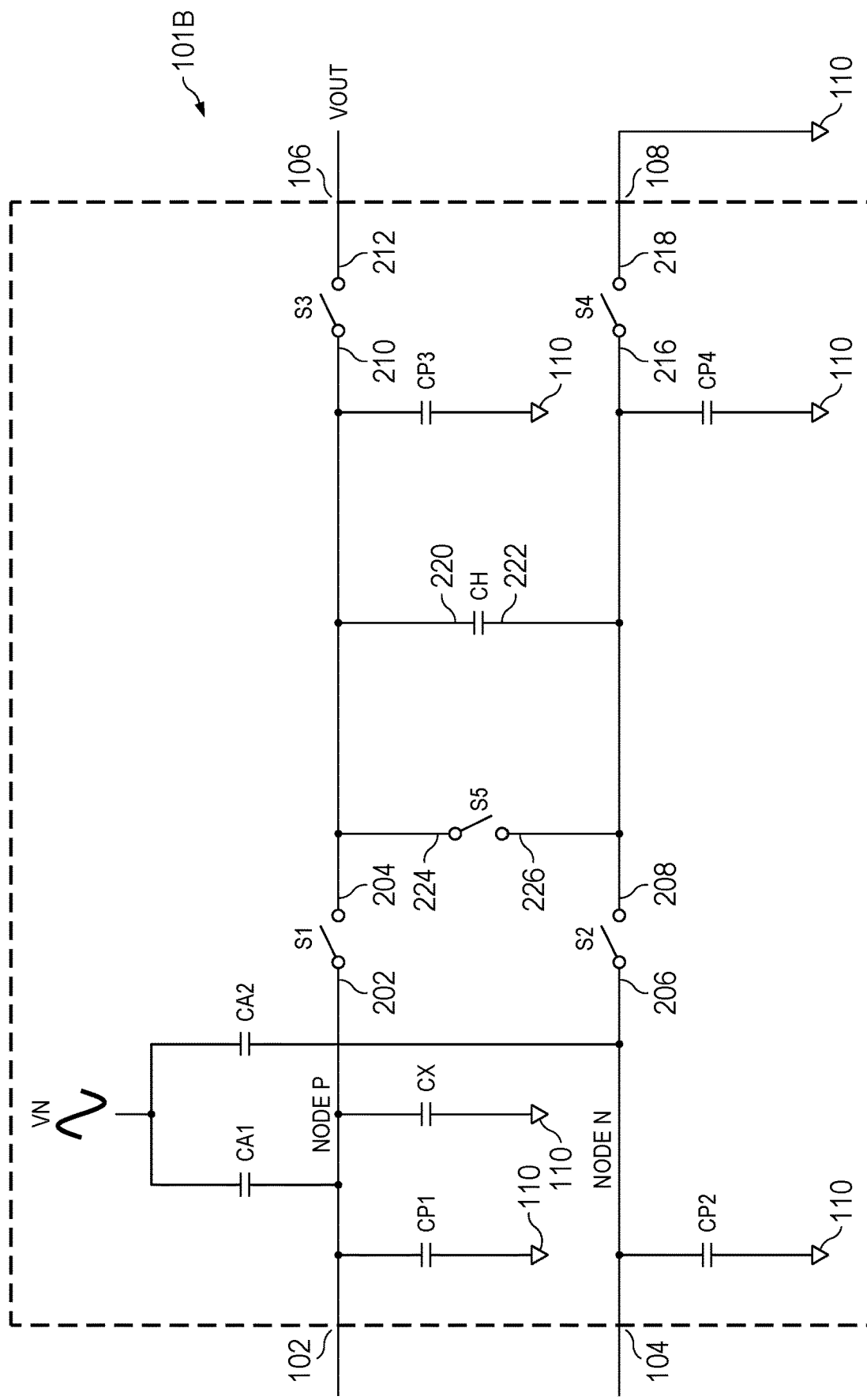
FIGS. 3A, 3B and 3C are schematic diagrams illustrating a differential to single-ended summation circuit of another example embodiment.

FIG. 3A is a schematic diagram illustrating differential to single-ended summation circuit 101B of an example embodiment. Circuit 101B is another implementation of summation circuit 101 illustrated in FIG. 1. Portions of circuit 101B are the same as circuit 101A of FIGS. 2A-2C. As such, these similar features share the same reference numbers in FIGS. 3A and 2A-2C.

Circuit 101B includes capacitor CX coupled between node P and common potential 110. Except for the presence of capacitor CX between node P and common potential 110, circuit 101B is essentially similar in all other respects to circuit 101A illustrated in FIGS. 2A-2C.

Because capacitor CX is coupled only to node P but is not coupled to node N, capacitor CX is coupled to only one of the differential lines of circuit 101B. Due to the presence of common-mode noise VN at node P, capacitor CX is charged by common-mode noise VN.

Figure 3B:
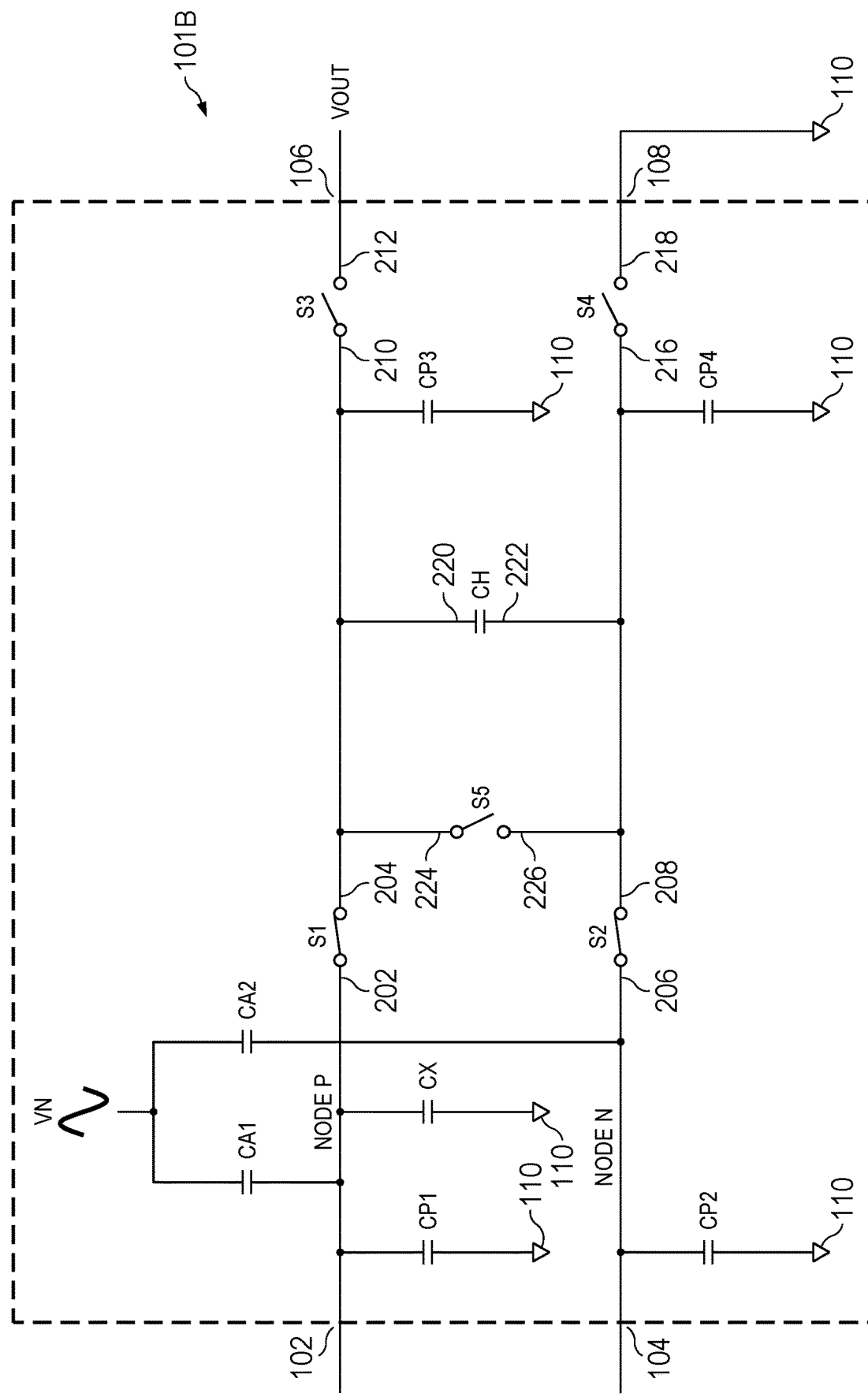

FIG. 3B is a schematic diagram illustrating positions of the switches in the summing phase. In the summing phase, switches S1 and S2 are closed but switches S3, S4 and S5 are open. Thus, first terminal 220 of holding capacitor CH is coupled to first circuit input 102 and second terminal 222 of CH is coupled to second circuit input 104. Because capacitor CX is coupled only to node P, but a corresponding capacitor is not coupled to node N, the attenuation of common-mode noise VN is greater at node P than at node N. As such, the voltage at node N rises above the voltage at node P. Because parasitic capacitor CP3 is coupled between first terminal 220 of CH and common potential 110, holding capacitor CH is charged with a negative voltage relative to parasitic capacitor CP3 in the summing phase.

Figure 3C:
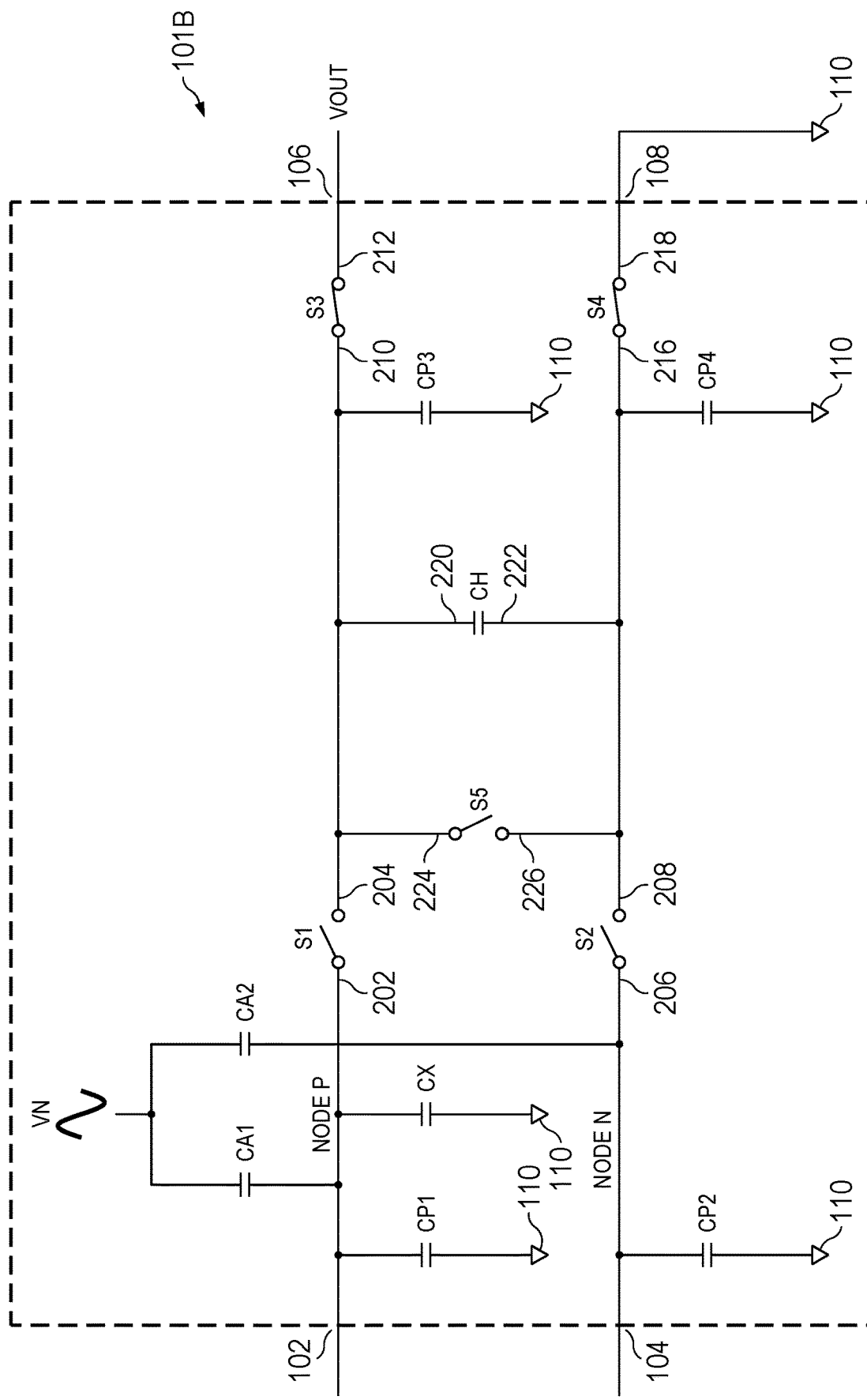

FIG. 3C is a schematic diagram illustrating the positions of the switches in the transfer phase. In the transfer phase, switches S1, S2 and S5 are opened but switches S3 and S4 are closed. Thus, first terminal 220 of holding capacitor CH is electrically disconnected from first circuit input 102 and second terminal 222 of CH is electrically disconnected from second circuit input 104. Also, first terminal 220 of CH is coupled to circuit output 106 and second terminal 222 of CH is coupled to common potential 110. Thus, in the transfer phase, CH is coupled in parallel to CP3. Also, in the transfer phase, because terminal 216 is coupled to common potential 110, any voltage across CP4 due to common-mode noise VN is discharged.

Because in the summing phase CH is charged to a negative voltage relative to CP3, when CH is coupled in parallel with CP3 in the transfer phase, any voltage across CP3 due to common-mode noise VN is reduced or minimized. As such, any voltage across CP3 has less or minimal impact on output voltage VOUT, thereby improving the CMRR of circuit 101B.

In the reset phase, switches S1, S2, S3 and S4 are opened but switch S5 is closed. Thus, any voltage across holding capacitor CH is discharged.

The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Any transistors used in any of the circuits disclosed herein may be of any suitable type. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value, or, if the value is zero, a reasonable range of values around zero.

What is claimed is:

1. A differential to single-ended summation circuit comprising:
    a first circuit input;
    a second circuit input;
    a circuit output;
    a first switch including a first terminal coupled to the first circuit input and including a second terminal;
    a second switch including a first terminal coupled to the second circuit input and including a second terminal;
    a holding capacitor including a first terminal coupled to the second terminal of the first switch and a second terminal coupled to the second terminal of the second switch;
    a third switch including a first terminal coupled to the second terminal of the first switch and a second terminal coupled to the circuit output;
    a fourth switch including a first terminal coupled to the second terminal of the second switch and a second terminal coupled to a common potential; and
    a fifth switch including a first terminal coupled to the first terminal of the holding capacitor and a second terminal coupled to the second terminal of the holding capacitor.

2. The circuit of claim 1, further comprising a second capacitor including a first terminal coupled to the first circuit input and a second terminal coupled to the common potential.

3. The circuit of claim 1, wherein the first and second switches are closed and the third and fourth switches are opened in a summing phase.

4. The circuit of claim 1, wherein the first and second switches are opened and the third and fourth switches are closed in a transfer phase.

5. The circuit of claim 1, wherein the fifth switch is opened in a summing phase and in a transfer phase, and wherein the fifth switch is closed in a reset phase.

6. A differential to single-ended summation circuit comprising:
    a first circuit input;
    a second circuit input;
    a circuit output;
    a first switch including a first terminal coupled to the first circuit input and including a second terminal;
    a second switch including a first terminal coupled to the second circuit input and including a second terminal;
    a holding capacitor including a first terminal coupled to the second terminal of the first switch and a second terminal coupled to the second terminal of the second switch;
    a third switch including a first terminal coupled to the second terminal of the first switch and a second terminal coupled to the circuit output;
    a fourth switch including a first terminal coupled to the second terminal of the second switch and a second terminal coupled to a common potential;
    a fifth switch including a first terminal coupled to the first terminal of the holding capacitor and a second terminal coupled to the second terminal of the holding capacitor; and
    a second capacitor including a first terminal coupled to the first circuit input and a second terminal coupled to the common potential.

7. The circuit of claim 6, wherein the first and second switches are closed and the third and fourth switches are opened in a summing phase.

8. The circuit of claim 6, wherein the first and second switches are opened and the third and fourth switches are closed in a transfer phase.

9. The circuit of claim 6, wherein the fifth switch is opened in a summing phase and in a transfer phase, and wherein the fifth switch is closed in a reset phase.

10. A system comprising:
    an amplifier including an amplifier input, a first amplifier output and a second amplifier output;
    a delay circuit including a first delay input coupled to the first amplifier output and a second delay input coupled to the second amplifier output and including a first delay output and a second delay output;
    a differential to single-ended summation circuit comprising:
        a first circuit input coupled to the first delay output;
        a second circuit input coupled to the second delay output;
        a circuit output;
        a first switch including a first terminal coupled to the first circuit input and including a second terminal;
        a second switch including a first terminal coupled to the second circuit input and including a second terminal;
        a holding capacitor including a first terminal coupled to the second terminal of the first switch and a second terminal coupled to the second terminal of the second switch;
        a third switch including a first terminal coupled to the second terminal of the first switch and a second terminal coupled to the circuit output;
        a fourth switch including a first terminal coupled to the second terminal of the second switch and a second terminal coupled to a common potential;
        a fifth switch including a first terminal coupled to the first terminal of the holding capacitor and a second terminal coupled to the second terminal of the holding capacitor; and
        a second capacitor including a first terminal coupled to the first circuit input and a second terminal coupled to the common potential.

11. The system of claim 10, wherein the amplifier is one of a plurality of amplifiers and the delay circuit is one of a plurality of delay circuits.

12. The system of claim 11, wherein each of the plurality of amplifiers includes an amplifier input adapted to receive an input voltage.

13. The system of claim 11, wherein each of the plurality of delay circuits includes a first delay input coupled to a respective one of the first amplifier outputs and includes a second delay input coupled to a respective one of the second amplifier outputs.

14. The system of claim 10, wherein each of a plurality of first delay outputs is coupled to the first circuit input and each of a plurality of second delay outputs is coupled to the second circuit input.

15. A differential to single-ended summation circuit comprising:
a first circuit input coupled to a first internal node;
a second circuit input coupled to a second internal node;
a circuit output;
a holding capacitor; and
switching circuitry configured to:
during a summing phase, connect the first and second circuit inputs to the holding capacitor, disconnect the holding capacitor from the circuit output, establish a first common-mode noise path from the first internal node to a common potential, and establish a second common-mode noise path from the second internal node to the common potential, and
during a transfer phase, disconnect the holding capacitor from the first and second circuit inputs and connect the holding capacitor to the circuit output and to the common potential.

16. The circuit of claim 15, wherein the switching circuitry includes a first switch coupled between the first internal node and a first terminal of the holding capacitor, and a second switch coupled between the second internal node and a second terminal of the holding capacitor.

17. The circuit of claim 16, wherein the switching circuitry includes a third switch coupled between the circuit output and the first terminal of the holding capacitor, and a fourth switch coupled between the second terminal of the holding capacitor and the common potential.

18. The circuit of claim 17, wherein the switching circuitry includes a fifth switch coupled between the first and second terminals of the holding capacitor.

\* \* \* \* \*